US011630132B2

(12) United States Patent
Sun et al.

(10) Patent No.: US 11,630,132 B2
(45) Date of Patent: Apr. 18, 2023

(54) FAST FARADAY CUP FOR MEASURING THE LONGITUDINAL DISTRIBUTION OF PARTICLE CHARGE DENSITY IN NON-RELATIVISTIC BEAMS

(71) Applicant: Fermi Research Alliance, LLC, Batavia, IL (US)

(72) Inventors: Ding Sun, Naperville, IL (US); Alexander Shemyakin, Geneva, IL (US)

(73) Assignee: FERMI RESEARCH ALLIANCE, LLC, Batavia, IL (US)

( * ) Notice: Subject to any disclaimer, the term of this patent is extended or adjusted under 35 U.S.C. 154(b) by 44 days.

(21) Appl. No.: 17/151,055

(22) Filed: Jan. 15, 2021

(65) Prior Publication Data

US 2021/0141005 A1    May 13, 2021

Related U.S. Application Data

(63) Continuation-in-part of application No. 16/101,982, filed on Aug. 13, 2018, now Pat. No. 10,914,766.

(51) Int. Cl.
 *G01R 19/00* (2006.01)
 *G01N 27/00* (2006.01)
 *G01N 27/62* (2021.01)
 *H01L 21/67* (2006.01)

(52) U.S. Cl.
 CPC ................. *G01R 19/0061* (2013.01)

(58) Field of Classification Search
 CPC .. G01R 19/00; G01R 19/0061; G01R 15/246; H01L 21/67; G01N 27/00; G01N 27/62
 See application file for complete search history.

(56) References Cited

U.S. PATENT DOCUMENTS

| 3,733,510 | A | * | 5/1973 | Fischer | ................... | H01J 23/36 |
| | | | | | | 315/3 |
| 4,608,493 | A | | 8/1986 | Hayafuji | | |
| 5,103,161 | A | | 4/1992 | Bogaty | | |

(Continued)

OTHER PUBLICATIONS

G. Guethlein, T. Houck, J. McCarrick, and S. Sampayan, "Faraday Cup Measurements of Ions Backstreaming into a Electron Beam Impinging on a Plasma Plume", LLNL, Livermore, CA (Submitted on Aug. 18, 2000), Accelerator Physics, arXiv:physics/0008165 [physics.acc-ph].

(Continued)

*Primary Examiner* — Neel D Shah
(74) *Attorney, Agent, or Firm* — Loza & Loza LLP; Kevin L. Soules

(57) ABSTRACT

A Fast Faraday Cup includes a group of electrodes including a grounded electrode having a through hole and a collector electrode configured with a blind hole that functions a collector hole. The electrodes are configured to allow a beam (e.g., a non-relativistic beam) to fall onto the grounded electrode so that the through hole cuts a beamlet that flies into the collector hole and facilitates measurement of the longitudinal distribution of particle charge density in the beam. The diameters, depths, spacing and alignment of the collector hole and the through hole are controllable to enable the Fast Faraday day cup to operate with a fast response time (e.g., fine time resolution) and capture secondary particles.

20 Claims, 6 Drawing Sheets

(56) References Cited

U.S. PATENT DOCUMENTS

| | | | |
|---|---|---|---|
| 5,554,926 | A | 9/1996 | Elmer et al. |
| 6,300,755 | B1 | 10/2001 | Elmer et al. |
| 7,012,419 | B2 * | 3/2006 | Deibele ................. H01J 37/244 |
| | | | 250/397 |
| 3,040,124 | A1 | 10/2011 | Berrian et al. |
| 8,350,556 | B2 | 1/2013 | Knuffman et al. |
| 8,530,851 | B2 * | 9/2013 | Abgaryan ............. H01J 37/244 |
| | | | 250/397 |
| 8,866,080 | B2 | 10/2014 | Bower et al. |
| 8,866,081 | B2 | 10/2014 | Bower et al. |
| 9,535,100 | B2 * | 1/2017 | McAninch ......... B23K 15/0026 |
| 2005/0212503 | A1 | 9/2005 | Deibele |
| 2005/0285047 | A1 | 12/2005 | Elmer et al. |
| 2007/0080302 | A1 | 4/2007 | Hwang |
| 2008/0088295 | A1 | 4/2008 | Teruya et al. |
| 2008/0128621 | A1 | 6/2008 | Berry |
| 2008/0283778 | A1 | 11/2008 | Tominatsu et al. |
| 2010/0308215 | A1 | 12/2010 | Vanderberg et al. |
| 2013/0134323 | A1 | 5/2013 | Abgaryan et al. |

OTHER PUBLICATIONS

F. Marcellini and M. Poggi, "Design of a Tapered Stripline Fast Faraday Cup for Measurements on Heavy Ion Beams: Problems and Solutions", AIP Conf.Proc. 451 (1998) No. 1, 522-528.

A. B. Sefkow, et al., "Fast Faraday cup to measure neutralized drift compression in intense ion charge bunches", Physical Review Special Topics—Accelerators and Beams 9, 052801 (2006), The American Physical Society.

M. Ferianis, et al., "Characterisation of Fast Faraday Cups at the Elettra LINAC", Proceedings DIPAC 2003—Mainz, Germany, uploaded by Mario Ferianis on Feb. 10, 2015.

W.R. Rawnsley, et al., "Bunch Shape Measurements Using Fast Faraday Cups and an Oscilloscope Operated by LabView Over Ethernet", https://www.semanticscholar.org/paper/Bunch-Shape-Measurements-Using-Fast-Faraday-Cups-an-Rawnsley-Laxdal/200b88c486cb172f8d4944482197514615ba1e44.

E. Ebrahimibasabi, S.A.H. Feghhi, and M. Khorsandi, "Design and Simulation of a New Faraday Cup for ES-200 Electrostatic Accelerator", Proceedings of RUPAC2012, Saint Petersburg, Russia—Control and diagnostic systems, ISBN 978-3-95450-125-0.

G.H. Roshani, M. Habibi, and M. Sohrabi, "An improved design of Faraday cup detector to reduce the escape of secondary electrons in plasma focus device by COMSOL", Vacuum 86 (2011) 250-253.

"Faraday Cup", Wikipedia, https://en.wikipedia.org/wiki/Faraday_cup.

* cited by examiner

FAST FARADAY CUP FOR MEASURING THE LONGITUDINAL DISTRIBUTION OF PARTICLE CHARGE DENSITY IN NON-RELATIVISTIC BEAMS

CROSS-REFERENCE TO RELATED PATENT APPLICATIONS

This application is a Continuation in Part of U.S. application Ser. No. 16/101,982, entitled "FAST FARADAY CUP FOR MEASURING THE LONGITUDINAL DISTRIBUTION OF PARTICLE CHARGE DENSITY IN NON-RELATIVISTIC BEAMS," filed on Aug. 13, 2018. application Ser. No. 16/101,982 is incorporated herein by reference in its entirety.

STATEMENT OF GOVERNMENT RIGHTS

The invention described in this patent application was made with Government support under the Fermi Research Alliance, LLC, Contract Number DE-AC02-07CH11359 awarded by the U.S. Department of Energy. The Government has certain rights in the invention.

TECHNICAL FIELD

Embodiments are generally related to the field of charged particle detectors. Embodiments also relate to Faraday cups used for measuring current in a beam of charged particles, and more particularly to a Fast Faraday Cup (FFC). Embodiments further relate to an FFC that measures the longitudinal distribution of particle charge density in non-relativistic beams.

BACKGROUND

Response time of an electronic device is related to its bandwidth in the frequency domain. The wider the bandwidth, the faster the response time. As such, there is a demand for wide bandwidth devices that provide very fast response time.

A Faraday cup is a simple detector of charged particle beams. A Faraday cup typically includes an inner cup concentrically located within a grounded outer cup. Faraday cups are known for their large dynamic range and ability to function in a wide range of environments, including for example, varying atmospheric pressures.

Well-designed and shielded Faraday cups have been reported to measure currents down to, for example, $10^{-15}$ A, corresponding to $10^4$ charged particles per second. While electron multipliers are more sensitive, Faraday cup detectors provide quantitative charge measurements with high precision and stable performance. For instance, electron multipliers are susceptible to degradation over time due to sputtering of the electron conversion material, and the gain of these detectors can vary depending on the mass of the impending ions.

Faraday cups can be used to measure current in a beam of charged particles. A Faraday cup may include a conducting metallic enclosure or cup that captures a charged particle beam in a vacuum. An electrical connection between the Faraday cup and a measuring instrument relays the current to the measuring instrument. While Faraday cups are useful, most also have limited bandwidth.

Furthermore, in some applications incoming high energy charged particles may impinge on a target, causing the sputtering effect. This occurs when electrons and atoms associated with the target are ejected out of the target. This sputtering effect negatively impacts measurement accuracy and creates a noisy background.

The methods and systems disclosed herein address these limitations by providing embodiments which have very wide bandwidth and very fast response time, as further detailed herein.

BRIEF SUMMARY

The following summary is provided to facilitate an understanding of some of the innovative features unique to the disclosed embodiments and is not intended to be a full description. A full appreciation of the various aspects of the embodiments disclosed herein can be gained by taking the entire specification, claims, drawings, and abstract as a whole.

It is, therefore, one aspect of the disclosed embodiments to provide for an improved charged particle detector.

It is another aspect of the disclosed embodiments to provide for an improved Fast Faraday Cup that does not require the use of a biasing voltage and therefore a biasing circuit.

It is a further aspect of the disclosed embodiments to provide for a Fast Faraday Cup composed of a plurality of electrodes including at least a grounded electrode and a collector electrode.

It is a further aspect of the disclosed embodiments to provide for a Fast Faraday Cup that measures the longitudinal distribution of particle charge density in non-relativistic beams.

The aforementioned aspects and other objectives and advantages can now be achieved as described herein. A Fast Faraday Cup is disclosed, which includes a plurality of electrodes including a grounded electrode having a through hole and a collector electrode configured with a blind hole that functions as a collector hole. The electrodes are configured to allow a beam (e.g., a non-relativistic beam) to fall onto the grounded electrode so that the through hole cuts a beamlet that flies into the collector hole and facilitates measurement of the longitudinal distribution of particle charge density in the beam. The diameters, depths, spacing and alignment of the collector hole and the through hole are controllable to enable the Fast Faraday day cup to operate with a fast response time (e.g., fine time resolution) and capture secondary particles.

The grounded electrode includes a hollow portion configured to meet spacing requirements of a coaxial transmission line. In addition, the Fast Faraday Cup can be configured with a coaxial cylindrical topology that includes at least two ports. The coaxial cylindrical topology includes the coaxial transmission line with a center conductor and an outer conductor. In addition, the collector electrode comprises at least a part of the center conductor. The grounded electrode includes a part of the outer conductor. The grounded electrode includes a hollow portion configured to meet spacing requirements of the coaxial transmission line and match to adjoining coaxial transmission lines.

Thus, in an example embodiment, an improved Fast Faraday Cup can be implemented, which includes two features: (1) at least two electrodes that include a "grounded electrode" with a small through hole (ID<1 mm) and a "collector electrode" with a small blind hole, to measure nanosecond time structure of bunched ion beam. The diameters, depths, spacing of the two aligned holes are controlled to enable this device to have fast time response and capture secondary particles that interfere the measurement of the beam; and (2) the two electrodes are custom configured in a coaxial cylindrical topology so that the device has a wide bandwidth of, for example, 20 GHz, 50 Ohm impedance and two connection ports. The combination of (1) and (2) above constitutes a Fast Faraday Cup capable of resolving details of the longitudinal distribution of beam at the level of <0.1 nanosecond without using any biasing circuit.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION

Figure 1:
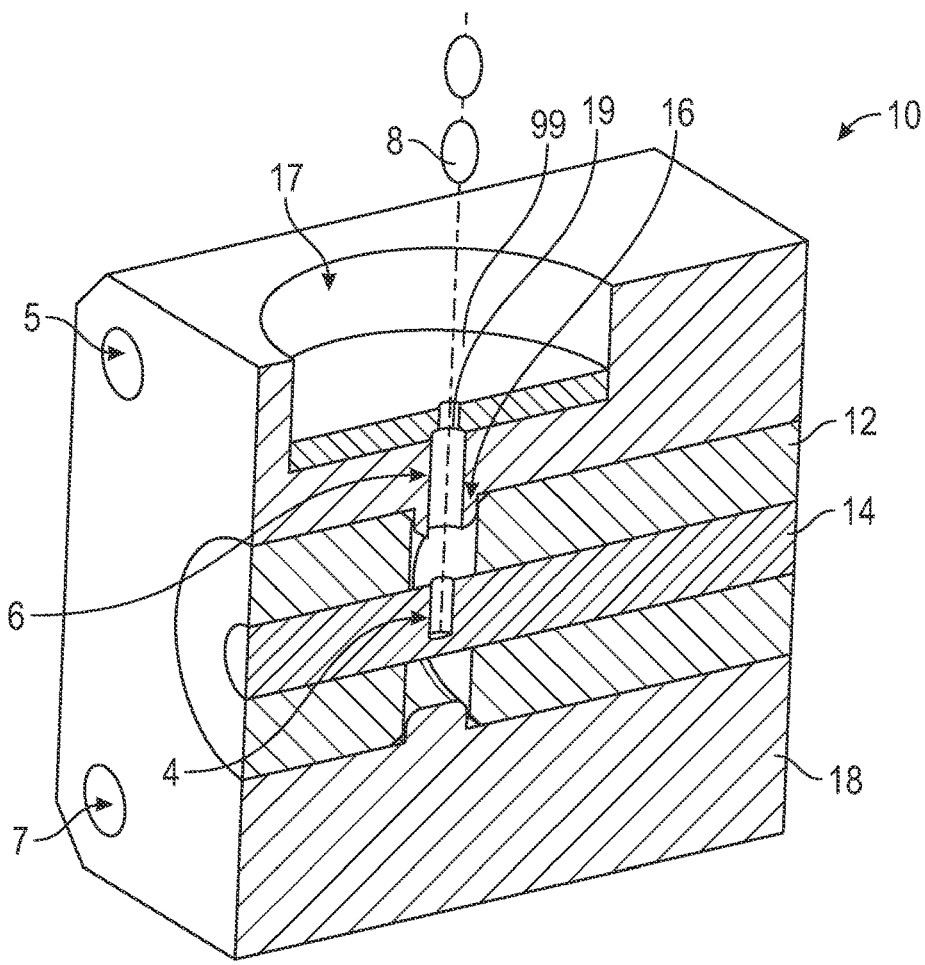
FIG. 1 illustrates a cut-away sectional view of a Fast Faraday Cup (FFC), in accordance with an example embodiment.

The particular values and configurations discussed in these non-limiting examples can be varied and are cited merely to illustrate one or more embodiments and are not intended to limit the scope thereof.

Subject matter will now be described more fully hereinafter with reference to the accompanying drawings, which form a part hereof, and which show, by way of illustration, specific example embodiments. Subject matter may, however, be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other things, for example, subject matter may be embodied as methods, devices, components, or systems/devices. Accordingly, embodiments may, for example, take the form of hardware, software, firmware or any combination thereof (other than software per se). The following detailed description is, therefore, not intended to be interpreted in a limiting sense.

Throughout the specification and claims, terms may have nuanced meanings suggested or implied in context beyond an explicitly stated meaning. Likewise, phrases such as "in one embodiment" or "in an example embodiment" and variations thereof as utilized herein do not necessarily refer to the same embodiment and the phrase "in another embodiment" or "in another example embodiment" and variations thereof as utilized herein may or may not necessarily refer to a different embodiment. It is intended, for example, that claimed subject matter include combinations of example embodiments in whole or in part.

In general, terminology may be understood, at least in part, from usage in context. For example, terms, such as "and", "or", or "and/or" as used herein may include a variety of meanings that may depend, at least in part, upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein, depending at least in part upon context, may be used to describe any feature, structure, or characteristic in a singular sense or may be used to describe combinations of features, structures, or characteristics in a plural sense. Similarly, terms such as "a", "an", or "the", again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context. Additionally, the term "step" can be utilized interchangeably with "instruction" or "operation".

Unless defined otherwise, all technical and scientific terms used herein have the same meanings as commonly understood by one of ordinary skill in the art. As used in this document, the term "comprising" means "including, but not limited to." The term "at least one" conveys "one or more". The term "at least two" conveys "two or more".

Note that as utilized herein, the term "Faraday cup" generally refers to a metal (conductive) cup configured to catch charged particles. The resulting current can be measured and used to determine the number of ions or electrons hitting the Faraday Cup. The Faraday cup is named after Michael Faraday who first theorized ions around 1830.

The disclosed embodiments are directed to a Fast Faraday cup using coaxial cylindrical topology for measuring the longitudinal charge density of a charged particle beam. The system can generally comprise a grounded hollow metal body, a center metal rod inside the grounded hollow metal body, and two hollow dielectric cylinders filling two separate portions of the grounded hollow metal body. The grounded hollow metal body can include a small aperture through which charged particles can pass and impinge a very small portion of the center metal rod. The center metal rod collects the impinging charged particles and transmits the electrical signals generated by the impinging charged particles through the adjacent portions of the system to end ports that can be connected to measuring device(s) such as a wide bandwidth fast oscilloscope via coaxial transmission lines.

The hollow volume inside the metal body can be cylindrical in shape. For the purpose of transmitting the signals to the two end ports, the center metal rod and the grounded hollow metal body together constitute a special coaxial transmission line. The metal rod is the inner conductor, and the hollow metal body is the outer conductor. This special coaxial transmission line can have three different portions: a center portion for receiving the charged particle, and two dielectric material filled portions. The diameter of the center metal rod and the inner diameters of the hollow metal body are controlled to make all three portions have same characteristic impedance which allows the system to provide a very wide bandwidth (for example, up to 20 GHz), and gives system a very fast response time (for example, up to <0.1 nanoseconds). The small aperture of the hollow metal body also allows the air inside the hollow volume of the metal body to be pumped out so that the system can be used in an ultra-high vacuum environment.

In certain embodiments, the center metal rod has a receiving hole (also referred to as a capturing hole or dead end hole). The ratio of the diameter to the depth of this hole is controlled, or the hole can be configured to be controllable, so that it not only receives all the incoming charged particles but also captures secondary electrons and particles generated by the impingement of the incoming particles, and prevents them from escaping the metal rod. This capturing function eliminates the need for extra biasing parts and circuits, used by most present Faraday cups, to generate extra electric field to push the secondary particles back to the beam target.

It should be noted that the Fast Faraday Cup is capable of measuring the charge distribution of the charged beam not only in longitudinal direction (beam trajectory direction), but also in transverse (horizontal or vertical) directions.

FIG. 1 illustrates a cut-away sectional view of a Fast Faraday Cup (FFC) 10, in accordance with an example embodiment. The FFC 10 generally includes a body 18 that surrounds a collector electrode 14, which in turn is located centrally within a coaxial transmission line 12. The body 18 is further configured with a plurality of holes such as holes 5 and 7 that extend through the body 18. Because FIG. 1 only illustrates half of a FFC 10, it should be appreciated that additional holes are also provided such as the holes 1 and 3 shown in FIG. 10. Holes 1, 3 and 5, 7 are configured to receive and maintain respective pins or screws.

The collector electrode 14 (i.e., the "collector") is configured with a small blind hole that functions as a receiving hole 4. Note that the receiving hole 4 functions as a collector hole; thus, the terms "receiving hole" and "collector hole" can be used interchangeably herein to refer to the same feature. The FFC 10 is further configured with a grounded electrode 16 (also referred to as "ground electrode") configured with a small through hole or aperture 6 (e.g., ID<1 mm). The grounded electrode 16 is generally formed from body 18. The FFC 10 is further configured with a generally circular or cylindrical recess 17. The recess 17 hosts a Molybdenum alloy TZM disk 99.

The through hole or aperture 6 of the ground electrode 16 extends from a receiving hole 4 configured in the collector electrode 14 to a collimating hole 19 in the TZM disk 99 located in the recess 17. The TZM disk 99 (which functions as a shielder) is configured with the collimating hole 19, which engages with, or forms a part of, the through hole 6 of the ground electrode 16. In general, a beam 8 falls onto the ground electrode 16 and the through hole 6 cuts a small beamlet that flies into the collector hole 4 (i.e., the receiving hole configured from the collector electrode 14). The diameters, depths, spacing and alignment of the collector hole 4 and the through hole 6 associated with the grounded electrode 16 are controllable to enable the FFC 10 to have a fast response time (e.g., a fine time resolution) and capture secondary particles as well.

The collector electrode 14 forms a part of the center conductor of the coaxial transmission line 12 (e.g., a 50 Ohm coaxial transmission line), which can be configured from a material such as, for example, Teflon. Note that if the collector electrode 14 is an added part, the bandwidth may be reduced. The geometry of the hollow part within the "ground electrode" 16 can be configured to meet the spacing requirements of, for example, the aforementioned coaxial transmission line. The true "grounded electrode" part is actually the center portion of the body 18. The FFC or the body 18 can be divided into three portions, which are shown in more detail in FIG. 9. These portions are the Teflon filled portion (left and right) which can either comprise, or otherwise interface with, the adjoining coaxial transmission lines, and the center portion which is the grounded electrode depicted in FIG. 9. One of the advantages of the disclosed FFC device is that these three parts can be configured from one part (i.e., "body") so that extra soldering and connecting are not necessary, which is important for very wide bandwidth.

Figure 2:
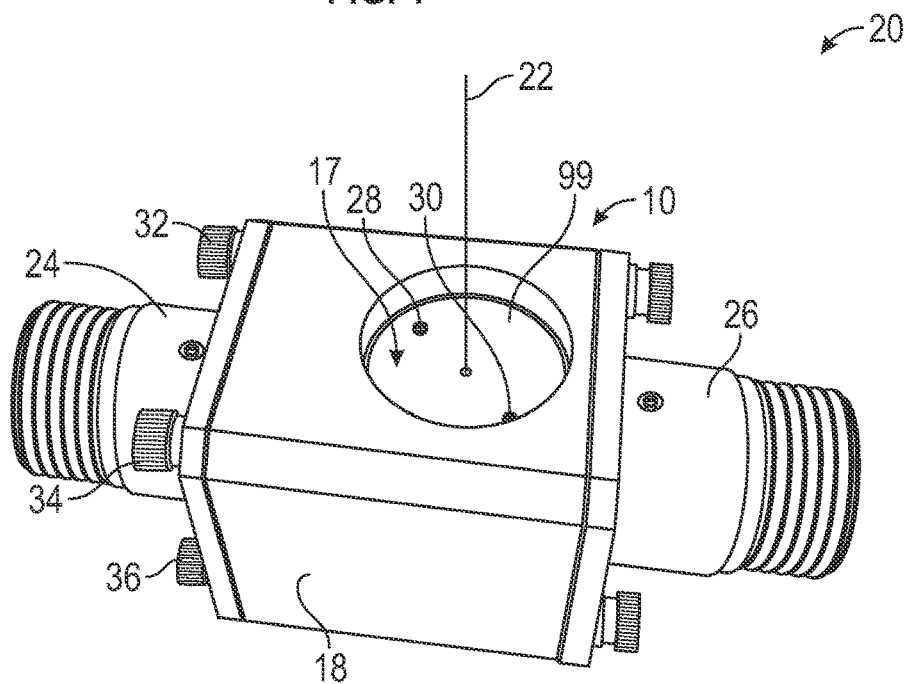
FIG. 2 illustrates an image of the FFC shown in FIG. 1, in accordance with an example embodiment.

FIG. 2 illustrates an image 20 of the FFC 10 shown in FIG. 1, in accordance with an example embodiment. Note that in FIGS. 1-2, identical or similar parts or elements are generally indicated by identical reference numerals. The FFC 10 is configured with a coaxial cylindrical topology having two ports 24 and 26, and can support a very wide bandwidth. Although the two ports 24 and 26 are shown in FIG. 2, it can be appreciated that additional ports may be implemented in the context of other embodiments.

The collector electrode 14 (not shown in FIG. 2, but depicted in FIG. 1) is located within the body 18 of the FFC 10. Note that the alignment of the grounded electrode 16 and the TZM disk 99 along with the various holes such as holes 4 and 19 can be verified through the use of a thin pin 22. That is, the pin 22 can be used as a part of a special machining and assembling procedure to ensure that the three small holes 4, 6 and 19 are precisely aligned and oriented to each other. Note that the TZM disk 99 (e.g., which has a high melting temperature) is configured as an attached part to protect the entrance area to the grounded electrode 16. Because the TZM disk 99 is attached to the grounded electrode 16, it can be considered a part of the grounded electrode 16. However, it should be appreciated that the TZM disk 99 and the grounded electrode 16 can also be configured as separate components.

The aforementioned TZM disk 99 can be further configured with two components 28 and 30 that may extend into respective holes 41 and 43 (i.e., shown in FIG. 10 but not in FIG. 2) configured in the body 18. Note that additional components 32, 34, and 36 are shown in FIG. 2, which respectively extend through holes 5, 3 and 1. Although not shown in FIG. 2, an additional component may extend through the hole 7.

Figure 3:
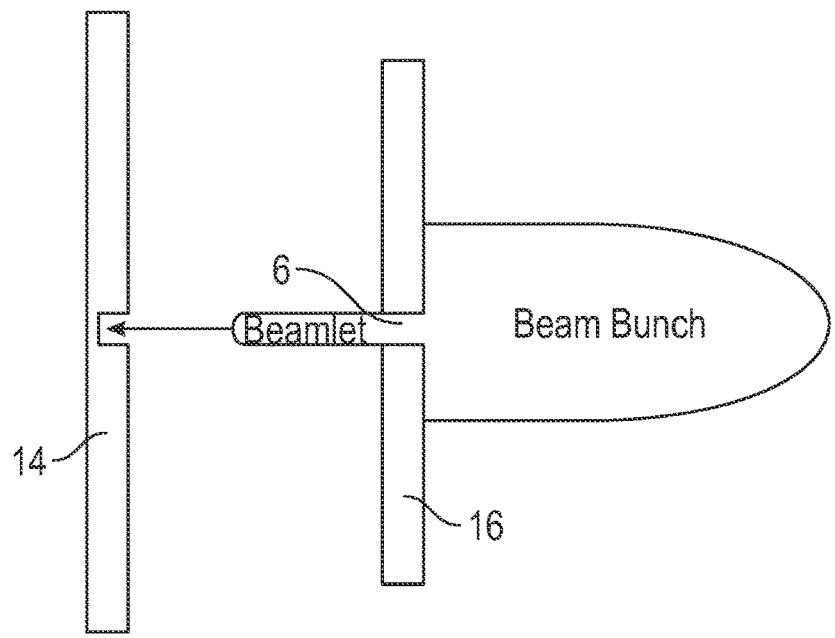
FIG. 3 illustrates a schematic diagram depicting how a beam bunch is cut into a beamlet by the components of the FFC, in accordance with an example embodiment.

FIG. 3 illustrates a schematic diagram depicting how a beam bunch is cut into a beamlet by the components of a FFC, in accordance with an example embodiment. The schematic diagram shown in FIG. 3 generally corresponds to a FFC such as the FFC 10 shown in FIGS. 1-2. Thus, the collector 14 is shown with respect to the grounded electrode 16. A beamlet is also shown. An area constituting an orifice is depicted in the center of the grounded electrode 16. An incoming beam bunch is shown hitting the aforementioned orifice. The aforementioned orifice generally corresponds to the holes 19 and 6 shown in FIGS. 1-2.

Figure 4:
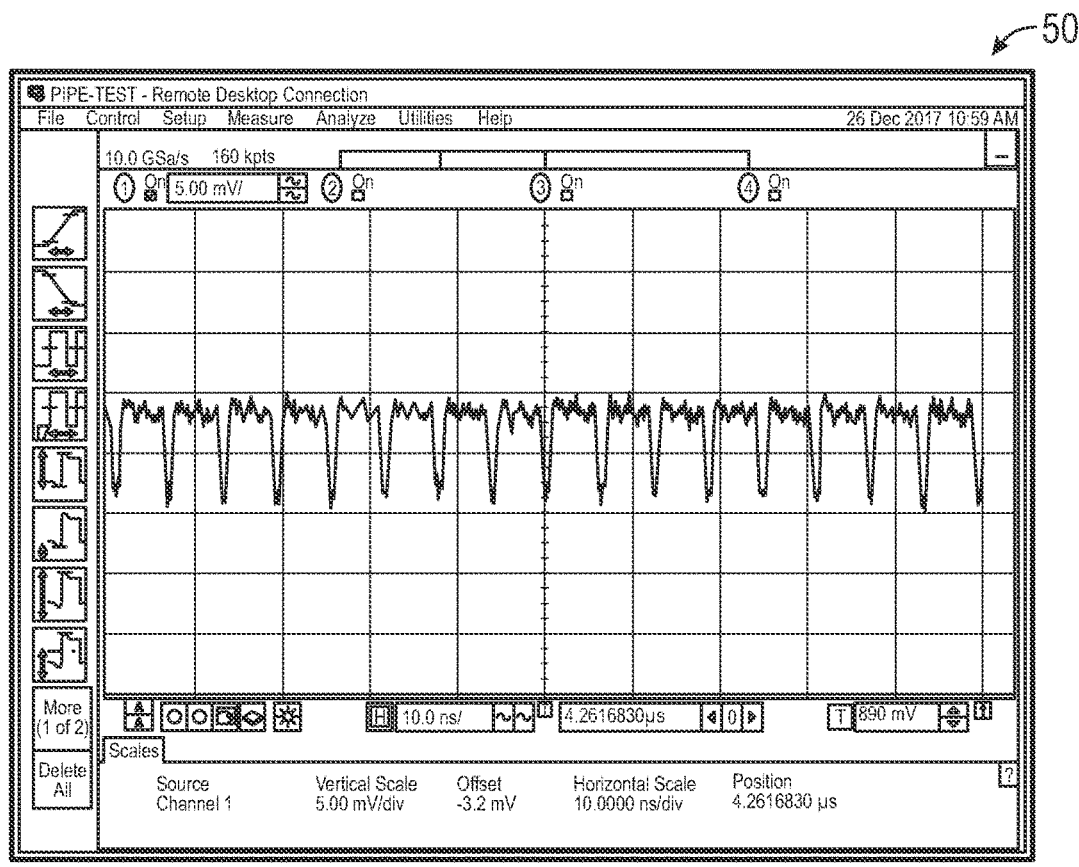
FIG. 4 illustrates a graph depicting beam measurement results of a FFC, in accordance with an example embodiment.
Figure 5:
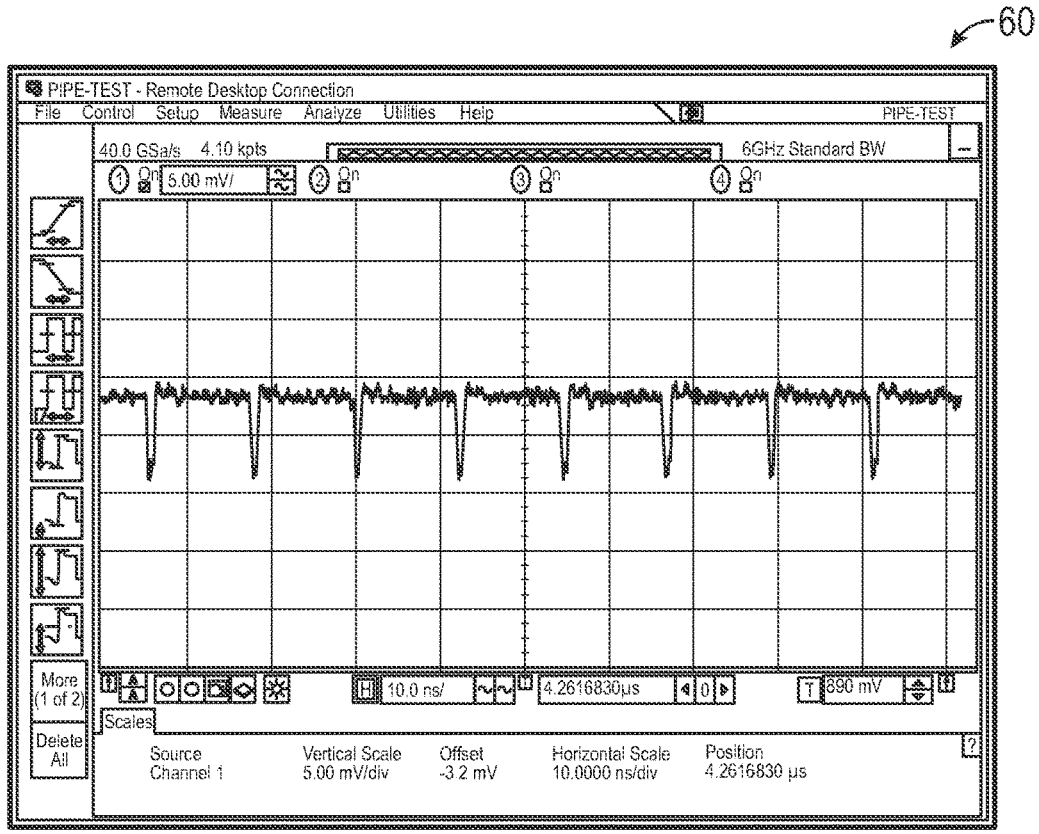
FIG. 5 illustrates another graph depicting beam measurement results of a FFC, in accordance with another example embodiment.

FIG. 4 illustrates a graph 50 depicting beam measurement results of a FFC, in accordance with an example embodiment. FIG. 5 illustrates another graph 60 depicting beam measurement results of a FFC, in accordance with another example embodiment.

Figure 6:
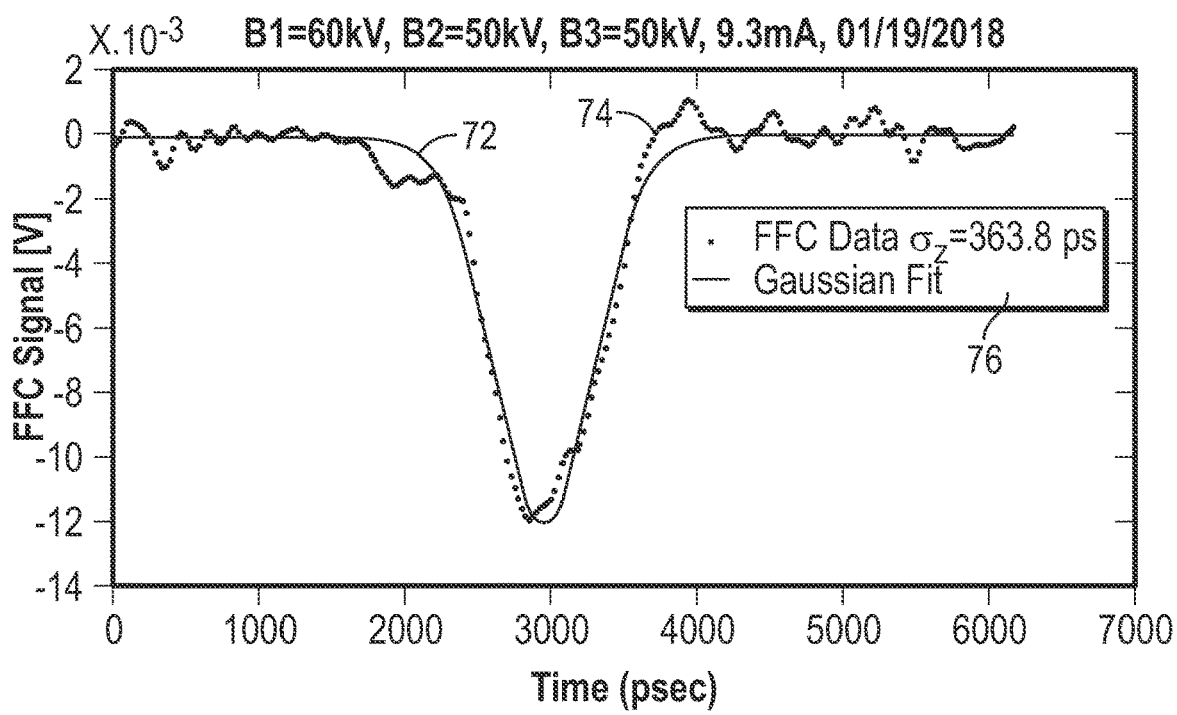
FIG. 6 illustrates yet another graph depicting beam measurement results of a FFC, in accordance with another example embodiment.

FIG. 6 illustrates yet another graph 70 depicting beam measurement results of a FFC, in accordance with another example embodiment. The beam test results shown in graph 70 are indicated by two lines 72 and 74 and correspond to the information contained in the legend 76. Line 72 represents data indicative of Gaussian fit. Line 74 is representative of FFC (Fast Faraday Cup) data wherein $\sigma_z$=363.8 ps. The graph or plot 70 shown in FIG. 7 generally plots FCC signal [V] data versus Time (psec).

Figure 7:
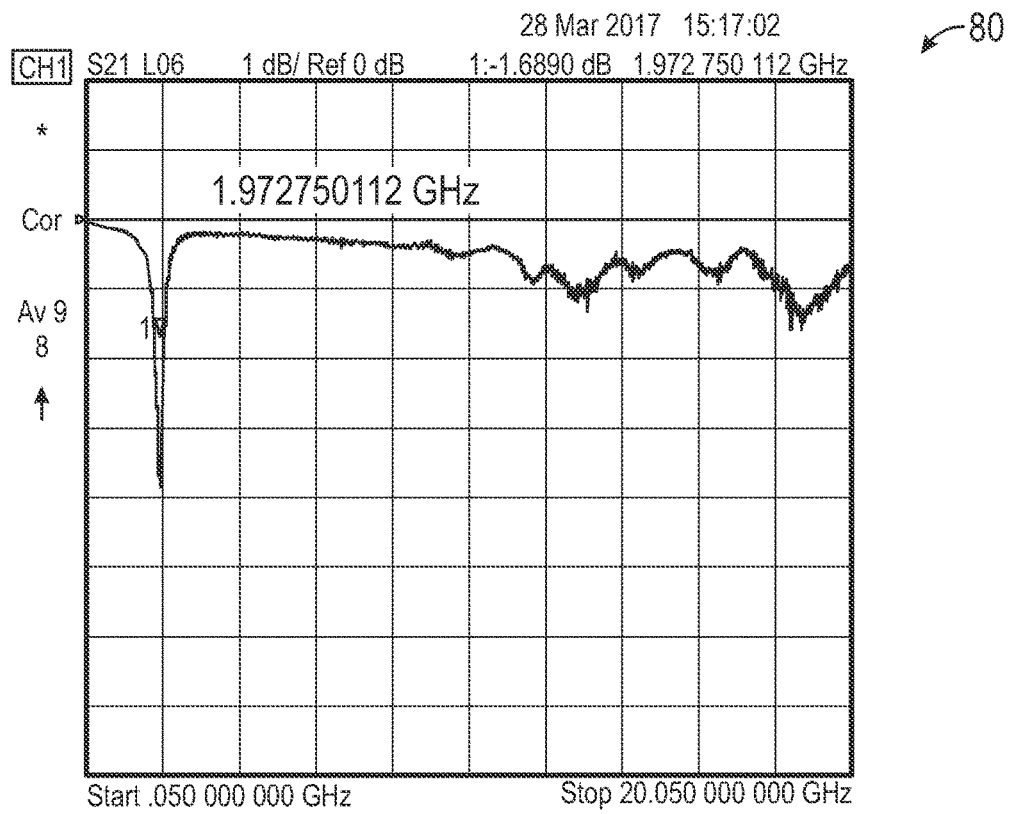
FIG. 7 illustrates a graph depicting insertion loss data for a FFC, in accordance with an example embodiment.

FIG. 7 illustrates a graph 80 depicting insertion loss data for a FFC, in accordance with an example embodiment, at a bandwidth of 20 GHz. Note that the notch at 1.972 GHz in graph 80 is not related to the tested FFC.

Figure 8:
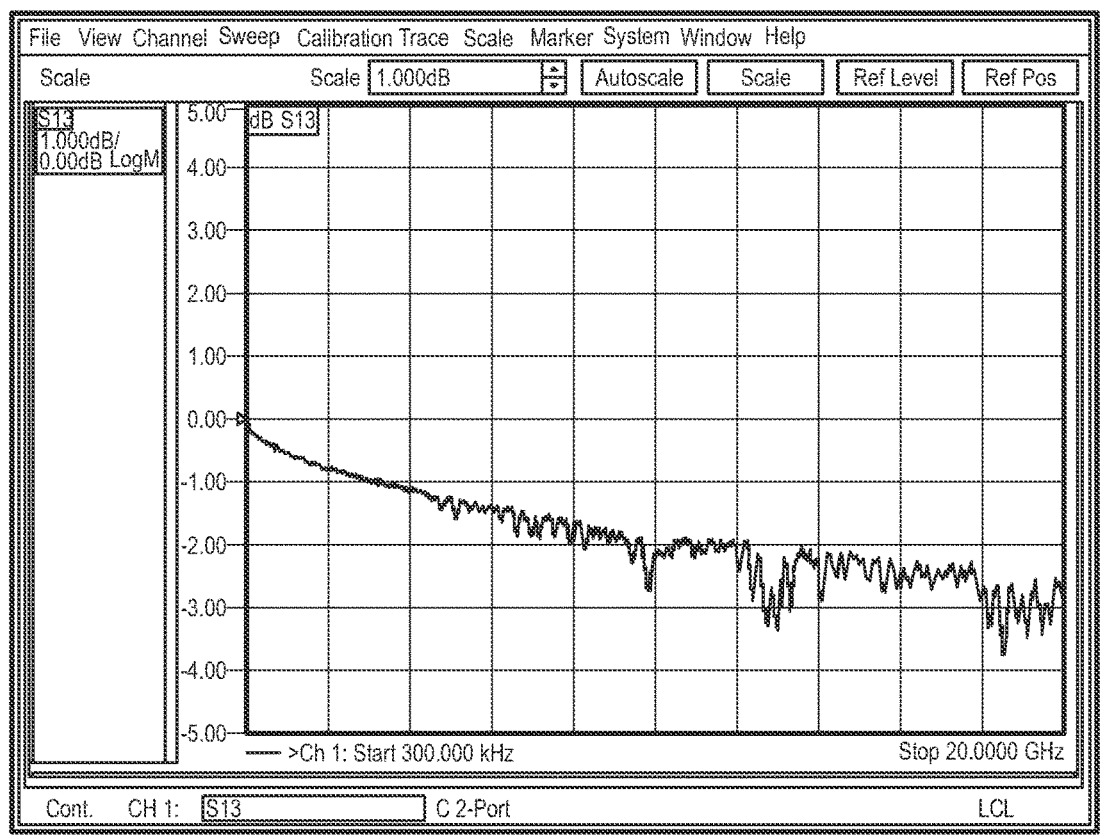
FIG. 8 illustrates another graph depicting insertion loss data for a FFC, in accordance with another example embodiment.

FIG. 8 illustrates another graph 90 depicting insertion loss data for a FFC, in accordance with yet another example embodiment. Graph 90 plots data indicative of the insertion loss of a tested FFC plus two 0.141" semi-rigid coaxial cables (e.g., ~21" of the total length) and two vacuum feedthroughs. It should be appreciated that the data contained in the various graphs 50, 60, 70, 80, and 90 are presented for general illustrative and exemplary purposes only and should not be considered limiting features of the disclosed embodiments.

Figure 9:
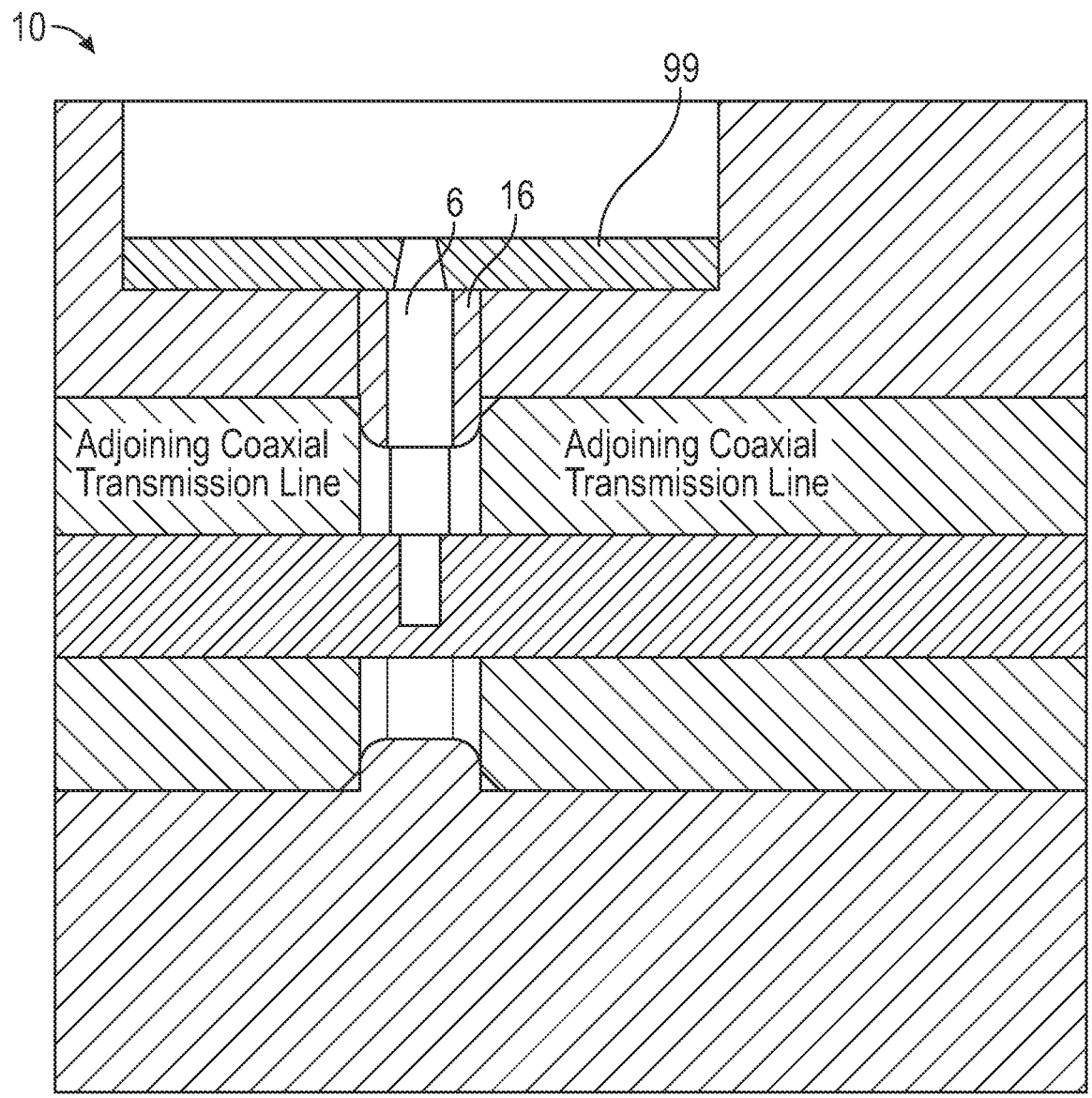
FIG. 9 illustrates a side view of a FFC, in accordance with an example embodiment.

FIG. 9 illustrates a side view of the FFC 10, in accordance with an example embodiment. FIG. 9 presents another view of the FFC 10 shown, for example, in FIGS. 1-2. As discussed previously, the true "grounded electrode" part can comprise the center portion of the body 18. The FFC or the body 18 can be divided into three portions, which are shown in more detail in FIG. 9. These portions are the Teflon filled portion (left and right) comprising "adjoining coaxial transmission lines," and the center portion comprising the "grounded electrode". An advantage of the disclosed FFC 10 is that these three parts can be configured from one part (i.e., the "body") so that extra soldering and connecting are not necessary, which is important to achieve a very wide bandwidth.

Figure 11:
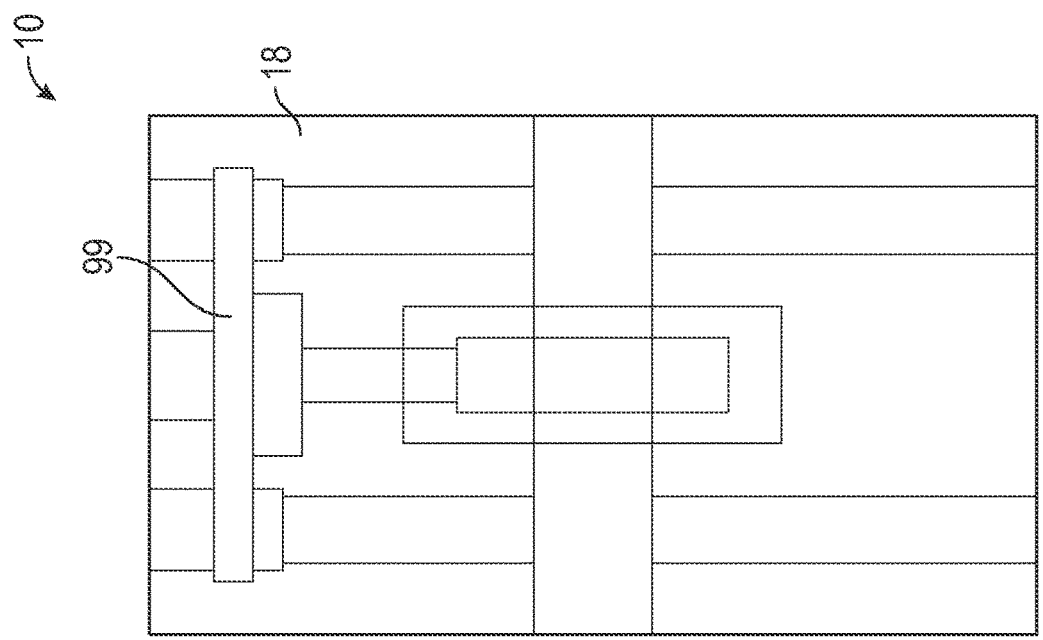
FIG. 11 illustrates a side view of a FFC, in accordance with an example embodiment.
Figure 10:
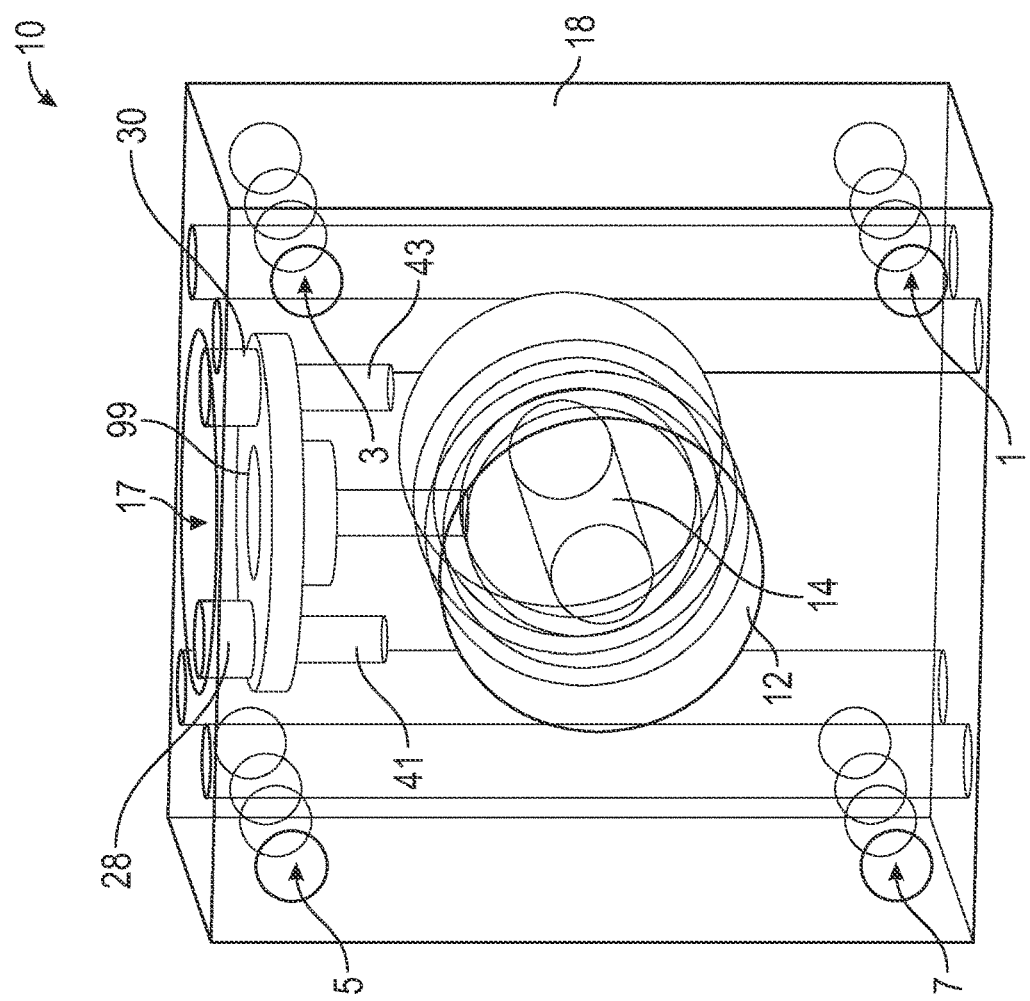
FIG. 10 illustrates a perspective view of a FFC, in accordance with an example embodiment.

FIG. 10 illustrates a perspective view of the FFC 10, in accordance with another example embodiment. FIG. 11 illustrates a side view of the FFC 10, in accordance with another embodiment. The FFC 10 includes body 18 which surrounds the collector electrode 14 located centrally within the coaxial transmission line 12. The body 18 is configured with a plurality of holes 1, 3 and 5, 7 that extend through the body 18. The screws 28 and 30 are also shown in FIG. 10 and are located above holes 41 and 43. The screws 28 and 30 are located on the grounded electrode 16 as discussed previously.

It should be appreciated that the configuration depicted in FIGS. 10-11 is that of an alternative embodiment, and that other designs and embodiments can be implemented which vary from the embodiments shown in FIGS. 10-11 and elsewhere herein.

Thus, as described herein a FFC can comprise a coaxial cylindrical topology for measuring the longitudinal charge density of a charged particle beam. The system can include a grounded hollow metal body, a center metal rod inside the grounded hollow metal body, and two hollow dielectric cylinders filling two separate portions of the grounded hollow metal body. The grounded hollow metal body can have a small aperture to allow charged particles to pass through and impinge a very small portion of the center metal rod. The center metal rod is configured to collect the charged particles and transmits the electrical signals generated by the charged particles through the adjacent portions of the system to end ports that are connected to measuring device(s) such as a high bandwidth fast oscilloscope.

Note the hollow volume inside the metal body can have a cylindrical shape. Therefor for the purpose of transmitting the signals to the two end ports, the center metal rod and the grounded hollow metal body together constitute a special coaxial transmission line. The metal rod is the center conductor, and the hollow metal body is the outer conductor. This special coaxial transmission line has three portions: a center portion for receiving said charged particle, a first portion filled with dielectric material, and a third portion filled with dielectric material. The diameter of the center metal rod and the inner diameters of the hollow metal body at the three portions are controlled to make all three portions have the same characteristic impedance, which enables said system to have a wide bandwidth of up to approximately 20 GHz, and enables said system to have fast response time.

It should be noted that the center metal rod has a receiving hole (i.e., a "capturing hole" or a "dead end hole"). The ratio of the diameter to the depth of this hole is controlled so that it not only receives the incoming charged particles but also captures secondary electrons or particles generated by the impinging of the incoming particles, and prevents them from escaping the metal rod. This capturing function eliminates the need for extra biasing parts and circuits used by most of present Faraday cups to push the secondary particles back to the beam target. The small aperture in the hollow metal body also allows the air inside the hollow volume to be pumped out so that the system can be used in ultra-high vacuum environment.

In certain embodiments, a special manufacturing and assembling method enables the capturing hole on the center metal rod and the aperture of the metal body to be made together (not separately) using electrical discharge machining after the metal rod and body are assembled. This process ensures the capturing hole in the metal rod and the aperture of metal body are aligned to extremely high accuracy (less than 0.001" of misalignment). This alignment accuracy minimizes the occurrence of incoming particles falling on the outside of the capturing hole.

Based on the foregoing, it can be appreciated that a number of example embodiments are disclosed herein. For example, in one embodiment, a FFC can be configured, which includes a plurality of electrodes including a ground electrode having a through hole and a collector electrode configured with a blind hole comprising a collector hole, wherein the plurality of electrodes are configured to allow a beam to fall onto the ground electrode so that the through hole cuts a beamlet that flies into the collector hole and facilitate a measurement of a longitudinal distribution of particle charge density in the beam.

In some example embodiments, the aforementioned collector hole and through hole can include parameters that are controllable to enable the FFC to perform the measurement with a fast response time of less than 0.1 nanosecond and capture secondary particles without requiring a use of a biasing voltage and therefore a biasing circuit. Such controllable parameters can include, for example, the diameter, the depth, the spacing and/or the alignment of the collector hole and the through hole.

In addition, the fast response time can comprise a fine time resolution. In some example embodiments, the ground electrode can be configured with a hollow portion configured to meet the spacing requirements of a coaxial transmission line. In still other example embodiments, the FFC can be configured with a coaxial cylindrical topology that includes two or more ports and the aforementioned coaxial transmission line. In still other example embodiments, the coaxial cylindrical topology can include a coaxial transmission line having a center conductor, wherein the collector electrode comprises at least a part of the center conductor.

In yet another example embodiment, the aforementioned coaxial cylindrical topology can be configured with a coaxial transmission line having a center conductor, such that the collector electrode includes at least a part of the center conductor. The ground electrode can include a hollow portion configured to meet the spacing requirements of the coaxial transmission line and match to adjoining coaxial transmission lines, thereby forming a device having, for example, a wide bandwidth of approximately 20 GHz and a fast response time. Note that the aforementioned 20 GHz bandwidth is not a limiting feature of the disclosed embodiments, but is one possible bandwidth size that can be facilitated by the disclosed device.

Additionally, note that because one transmission line has two ends, both ends can be "matched" in order to achieve excellent performance. Hence, in some example embodiments, the FFC disclosed herein can be configured with a coaxial cylindrical topology that includes a coaxial transmission line, which matches to at least two (i.e., two or more) adjoining coaxial transmission lines.

In certain embodiments, A Fast Faraday Cup, can comprise a grounded hollow conducting body, a conducting rod configured inside the grounded hollow conducting body, at least two hollow dielectric cylinders within the grounded hollow conducting body, an aperture in the grounded hollow conducting body configured to allow charged particles to reach the conducting rod, and at least two ports operably connected to the conducting rod. The grounded hollow conducting body can further comprise a metal grounded hollow conducting body. The conducting rod can further comprise a metal non-grounded hollow conducting cylinder. The hollow portion in the hollow conducting body can be cylindrical. The at least two hollow dielectric cylinders within the grounded hollow conducting body can comprise two hollow dielectric cylinders within the grounded hollow conducting body. The diameter of the conducting rod and an inner diameter of the grounded hollow conducting body can be selected to have a substantially matching characteristic impedance. The Fast Faraday Cup can have a bandwidth of up to 20 GHz. The Fast Faraday Cup can have a response time of less than 0.1 nanoseconds. The aperture in the grounded hollow conducting body can be configured to allow a vacuum to be drawn in a hollow volume of the Fast Faraday Cup. The Fast Faraday Cup can further comprise a receiving hole in the conducting rod. The ratio of a diameter of the receiving hole to a depth of the receiving hole is selected so that the receiving hole captures incoming charged particles and secondary particles. The receiving hole is configured to prevent the incoming charged particles and the secondary particles from escaping the conducting rod. A recess can be formed in the grounded hollow conducting body. A TZM disk can be configured in the recess formed in the grounded hollow conducting body.

In another embodiment a Fast Faraday Cup, comprises a coaxial transmission line further comprising: a grounded hollow conducting body, a conducting rod configured inside the grounded hollow conducting body, and at least two hollow dielectric cylinders within the grounded hollow conducting body; and an aperture in the grounded hollow conducting body configured to allow charged particles to reach the conducting rod. The coaxial transmission line further comprises three portions comprising a center portion for receiving charged particles, a first portion filled with dielectric material, and a second portion filled with dielectric material. The diameter of the conducting rod and an inner diameter of the grounded hollow conducting body at the three portions can be controlled such that the three portions have the same characteristic impedance.

In another embodiment a method of configuring a Fast Faraday Cup comprises providing a coaxial transmission line further comprising a grounded hollow conducting body, a conducting rod configured inside the grounded hollow conducting body, at least two hollow dielectric cylinders within the grounded hollow conducting body, and a through hole and a collector hole, configuring said coaxial transmission line to allow a beam to fall onto said grounded hollow conduct body so that the through hole cuts a beamlet that flies into the collector hole and facilitate a measurement of a distribution of particle charge density in the beam. The method further comprises controlling a diameter, a depth, a spacing and/or an alignment of the collector hole and the through hole to enable the Fast Faraday Cup to perform the measurement with a fast response time of less than 0.1 nanosecond and capture secondary particles without requiring a use of a biasing voltage. The method further comprises configuring the coaxial transmission line to match at least two different adjoining coaxial transmission lines.

It will be appreciated that variations of the above-disclosed and other features and functions, or alternatives thereof, may be desirably combined into many other different systems or applications. It will also be appreciated that various presently unforeseen or unanticipated alternatives, modifications, variations or improvements therein may be subsequently made by those skilled in the art which are also intended to be encompassed by the following claims.

What is claimed is:

1. A Fast Faraday Cup, comprising:
   a cylindrical transmission line comprising:
      a grounded hollow conducting body;
      a conducting rod configured inside the grounded hollow conducting body; and
      at least two hollow dielectric cylinders within the grounded hollow conducting body;
   an aperture serving as a receiving hole in the grounded hollow conducting body configured to allow charged particles to reach the conducting rod; and
   at least two ports operably connected to the conducting rod.

2. The Fast Faraday Cup of claim 1 wherein the grounded hollow conducting body further comprises:
   a metal grounded hollow conducting body.

3. The Fast Faraday Cup of claim 1 wherein the conducting rod further comprises:
   a metal non-grounded hollow conducting cylinder.

4. The Fast Faraday Cup of claim 1 wherein the hollow portion in a hollow conducting body is cylindrical.

5. The Fast Faraday Cup of claim 1 wherein the at least two hollow dielectric cylinders within the grounded hollow conducting body comprise two hollow dielectric cylinders within the grounded hollow conducting body.

6. The Fast Faraday Cup of claim 1 wherein a diameter of the conducting rod and an inner diameter of the grounded hollow conducting body are selected to have a substantially matching characteristic impedance.

7. The Fast Faraday Cup of claim 1 wherein the Fast Faraday Cup has a wide bandwidth of up to 20 GHz.

8. The Fast Faraday Cup of claim 1 wherein the Fast Faraday Cup has a response time of less than 0.1 nanoseconds.

9. The Fast Faraday Cup of claim 1 wherein the aperture in the grounded hollow conducting body is configured to allow a vacuum to be drawn in a hollow volume of the Fast Faraday Cup.

10. The Fast Faraday Cup of claim 1 further comprising:
a receiving hole in the conducting rod.

11. The Fast Faraday Cup of claim 10 wherein a ratio of a diameter of the receiving hole to a depth of the receiving hole is selected so that the receiving hole captures incoming charged particles and secondary particles.

12. The Fast Faraday Cup of claim 10 wherein the receiving hole is configured to prevent the incoming charged particles and secondary particles from escaping the conducting rod.

13. The Fast Faraday Cup of claim 1 further comprising:
a recess formed in the grounded hollow conducting body, with a a Molybdenum alloy TZM disk therein.

14. The Fast Faraday Cup of claim 13 further comprising:
a TZM disk configured in the recess formed in the grounded hollow conducting body.

15. A Fast Faraday Cup, comprising:
a coaxial transmission line further comprising:
    a grounded hollow conducting body;
    a conducting rod configured inside the grounded hollow conducting body; and
    at least two hollow dielectric cylinders within the grounded hollow conducting body; and
an aperture in the grounded hollow conducting body configured to allow charged particles to reach the conducting rod.

16. The Fast Faraday Cup of claim 15 wherein the coaxial transmission line further comprises three portions comprising:
a center portion for receiving charged particles;
a first portion filled with dielectric material; and
a second portion filled with dielectric material.

17. The Fast Faraday Cup of claim 16 wherein a diameter of the conducting rod and an inner diameter of the grounded hollow conducting body at the three portions are controlled such that the three portions have a same characteristic impedance.

18. A method of configuring a Fast Faraday Cup, said method comprising:
providing a coaxial transmission line further comprising a grounded hollow conducting body, a conducting rod configured inside the grounded hollow conducting body, at least two hollow dielectric cylinders within the grounded hollow conducting body, and a through hole and a collector hole;
configuring said coaxial transmission line to allow a beam to fall onto said grounded hollow conducting body so that the through hole cuts a beamlet that flies into the collector hole and facilitate a measurement of a distribution of particle charge density in the beam.

19. The method of claim 18 further comprising controlling a diameter, a depth, a spacing and/or an alignment of the collector hole and the through hole to enable the Fast Faraday Cup to perform the measurement with a fast response time of less than 0.1 nanosecond and capture secondary particles without requiring a use of a biasing voltage.

20. The method of claim 18 further comprising:
configuring the coaxial transmission line to match at least two different adjoining coaxial transmission lines.

* * * * *